(12) United States Patent
Sahara et al.

(10) Patent No.: US 6,633,081 B2
(45) Date of Patent: Oct. 14, 2003

(54) SEMICONDUCTOR DEVICE ON A PACKAGING SUBSTRATE

(75) Inventors: Ryuiti Sahara, Hirakata (JP); Nozomi Simoishizaka, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/159,725

(22) Filed: May 29, 2002

(65) Prior Publication Data

US 2002/0180041 A1 Dec. 5, 2002

(30) Foreign Application Priority Data

May 30, 2001 (JP) .......................... 2001-162261

(51) Int. Cl.[7] .............................................. H01L 23/48
(52) U.S. Cl. .................... 257/738; 257/777; 257/778
(58) Field of Search ................................ 257/777, 778, 257/738

(56) References Cited

U.S. PATENT DOCUMENTS 6,294,406 B1 * 9/2001 Bertin et al. ................ 438/109

FOREIGN PATENT DOCUMENTS

| JP | 6-132474 | 5/1994 |
| JP | 8-213427 | 8/1996 |

* cited by examiner

Primary Examiner—Thien Tran
(74) Attorney, Agent, or Firm—Merchant & Gould P.C.

(57) ABSTRACT

A semiconductor device is to be mounted on a packaging substrate. The semiconductor device includes a first semiconductor chip, a plurality of first electrode pads provided on a surface of the first semiconductor chip on a side of the packaging substrate, for electrically connecting the first semiconductor chip to the packaging substrate, a second semiconductor chip mounted on the first semiconductor chip so as to be surrounded by the plurality of first electrode pads, and protruding electrodes respectively provided so as to protrude from the first electrode pads toward the packaging substrate so that their surfaces are substantially flush with a surface of the second semiconductor chip on a side of the packaging substrate.

7 Claims, 7 Drawing Sheets

SEMICONDUCTOR DEVICE ON A PACKAGING SUBSTRATE

BACKGROUND OF THE INVENTION

1. Field of the Invention

The present invention relates to a chip size semiconductor device that can be mounted densely on a packaging substrate with high mounting efficiency and high reliability, and a method for manufacturing the same. In particular, the present invention relates to a semiconductor device that can be manufactured at a semiconductor wafer level and has a highly reliable structure, and a method for manufacturing the same.

2. Description of Related Art

Accompanying the reduction in size and weight and the densification of portable appliances in recent years, there has been an increasingly denser mounting of semiconductor packages having a lead terminal as an external electrode. In order to mount such semiconductor packages on a packaging substrate more densely, a technology of mounting a chip size semiconductor package on a packaging substrate has been developed.

The following is a description of a conventional semiconductor device, with reference to accompanying drawings. FIG. 3A is a perspective view showing a conventional semiconductor device 90. FIG. 3B is a sectional view thereof taken along the line A—A shown in FIG. 3A.

The semiconductor device 90 includes a substantially rectangular parallelepiped semiconductor chip 93. On the periphery of a principal surface of the semiconductor chip 93, a plurality of electrode pads 92 are provided. Each of the electrode pads 92 is connected to a semiconductor integrated circuit element (not shown) formed inside the semiconductor chip 93. On the principal surface of the semiconductor chip 93, an insulating layer 81 is formed in such a manner as to be surrounded by the plurality of electrode pads 92. The insulating layer 81 is formed of a low-elasticity resin having an insulating property. On the insulating layer 81, a plurality of contact pads 83 are formed in a matrix form. Each of the contact pads 83 is connected to one of the plurality of electrode pads 92 via a fine wiring layer 98, which is formed of a metal conductor. An insulating resin layer 82 with a plurality of openings respectively reaching the contact pads 83 also is formed on the insulating layer 81. In the perspective view of FIG. 3A, a part of the insulating resin layer 82 is omitted for the purpose of illustrating the electrode pads 92, the insulating layer 81, the wiring layers 98 and the contact pads 83 that are formed under the insulating resin layer 82. In each of the openings provided in the insulating resin layer 82, a substantially spheroidal solder ball 97 is placed so as to be connected to the contact pad 83. Each of the solder balls 97 forms a protruding electrode.

As described above, the plurality of electrode pads 92 provided on the periphery of the principal surface of the semiconductor chip 93 are rewired via the fine wiring layers 98 and the contact pads 83 to the solder balls 97, which are arranged two-dimensionally on the principal surface of the semiconductor chip 93.

A method for manufacturing the conventional semiconductor device 90 with the above structure will be described with reference to FIGS. 4A to 4G. FIGS. 4A to 4G are sectional views for describing the method for manufacturing the conventional semiconductor device 90.

First, as shown in FIG. 4A, a semiconductor wafer 91 in which a plurality of the substantially rectangular parallelepiped semiconductor chips 93 are formed is prepared. The plurality of electrode pads 92 are arranged on the periphery of the principal surface of each of the semiconductor chips 93 formed in the semiconductor wafer 91. Each of the electrode pads 92 is connected to the semiconductor integrated circuit element (not shown) formed inside the semiconductor chip 93.

Next, as shown in FIG. 4B, on the principal surface of each of the semiconductor chips 93 formed in the semiconductor wafer 91, the insulating layer 81 is formed in such a manner as to be surrounded by the plurality of electrode pads 92. The insulating layer 81 is formed of a low-elasticity resin having an insulating property.

Then, as shown in FIG. 4C, on the insulating layer 81 formed on the principal surface of each of the semiconductor chips 93 formed in the semiconductor wafer 91, a plurality of the contact pads 83 are formed in a matrix form. The fine wiring layer 98 for connecting each of the contact pads 83 to one of the plurality of electrode pads 92 is formed with a metal conductor.

Thereafter, as shown in FIG. 4D, the insulating resin layer 82 with a plurality of the openings respectively reaching the contact pads 83 is formed on the insulating layer 81 formed on the principal surface of the semiconductor chip 93.

Subsequently, as shown in FIG. 4E, in each of the openings provided in the insulating resin layer 82, the substantially spheroidal solder ball 97 is placed so as to be connected to the contact pad 83. Each of the solder balls 97 forms the protruding electrode.

Then, as shown in FIG. 4F, the semiconductor wafer 91 and the insulating resin layer 82 are cut with a rotating blade 23 from above the semiconductor wafer 91 along a dicing scribe line 84 set between the plurality of semiconductor chips 93 formed in the semiconductor wafer 91, thus obtaining a semiconductor device as shown in FIG. 4G. The semiconductor device that has been separated from the semiconductor wafer 91 and is shown in FIG. 4G has the same structure as the semiconductor device 90 described above referring to FIGS. 3A and 3B. According to the above-described processes, a high-density chip-type semiconductor device suitable for being mounted on a substrate can be manufactured.

However, in the conventional semiconductor device 90 described above, since the fine wiring layers 98 for connecting the electrode pads 92 provided on the principal surface of the semiconductor chip 93 and the solder balls 97 serving as the protruding electrodes provided on the insulating layer 81 formed on the principal surface of the semiconductor chip 93 extend over a slope-like step between the insulating layer 81 and the principal surface of the semiconductor chip 93, the wiring layers 98 may break at this slope-like step. Accordingly, there is a problem of poor reliability of the structure for connecting the electrode pads provided on the periphery of the principal surface of the semiconductor chip and the protruding electrodes provided substantially at the center of the principal surface of the semiconductor chip.

SUMMARY OF THE INVENTION

It is an object of the present invention to solve the problem described above and to provide a semiconductor device having a highly reliable structure, and a method for manufacturing the same.

It is a further object of the present invention to provide a semiconductor device, in which a structure for connecting electrode pads and protruding electrodes provided on a principal surface of a semiconductor chip has an improved reliability, and a method for manufacturing the same.

A semiconductor device according to the present invention is a semiconductor device to be mounted on a packaging substrate. The semiconductor device includes a first semiconductor chip, a plurality of first electrode pads provided on a surface of the first semiconductor chip on a side of the packaging substrate, for electrically connecting the first semiconductor chip to the packaging substrate, a second semiconductor chip mounted on the first semiconductor chip so as to be surrounded by the plurality of first electrode pads, and protruding electrodes respectively provided so as to protrude from the first electrode pads toward the packaging substrate so that their surfaces are substantially flush with a surface of the second semiconductor chip on a side of the packaging substrate.

Accordingly, the protruding electrodes for electrically connecting the first semiconductor chip to the packaging substrate respectively are provided so as to protrude from the first electrode pads provided on the surface of the first semiconductor chip on the side of the packaging substrate toward the packaging substrate, and the surfaces of the protruding electrodes are substantially flush with the surface of the second semiconductor chip on the side of the packaging substrate. The second semiconductor chip is mounted on the surface of the first semiconductor chip on the side of the packaging substrate. This improves the reliability of the structure for electrically connecting the first semiconductor chip provided in the semiconductor device to the packaging substrate, compared with the conventional structure in which the wiring layers break easily at the slope-like step between the insulating layer and the principal surface of the first semiconductor chip, because no protruding electrode is provided.

It may be possible to further include a plurality of second electrode pads, provided on the surface of the first semiconductor chip, for electrically connecting the second semiconductor chip to the first semiconductor chip. The surface of the first semiconductor chip is provided with a resin formed so as to seal at least a gap between the first semiconductor chip and the second semiconductor chip.

A surface of the resin may be formed to be substantially flush with the surface of the second semiconductor chip on the side of the packaging substrate.

The plurality of first electrode pads may be provided on a periphery of the surface of the first semiconductor chip.

It may be possible further to include external electrodes respectively provided so as to correspond to the protruding electrodes, for connecting the protruding electrodes to the packaging substrate on which the semiconductor device is to be mounted.

The external electrodes may be arranged on the surface of the second semiconductor chip on the side of the packaging substrate. It may be possible further to include wirings for connecting the protruding electrodes to the external electrodes corresponding to the protruding electrodes.

First ends of the wirings may be connected to the surfaces of the protruding electrodes, and second ends of the wirings may extend on the surface of the second semiconductor chip on the side of the packaging substrate and be connected to the external electrodes.

It may be possible further to include a resist resin that is provided so as to cover the second semiconductor chip and the wirings and has a plurality of openings formed for connecting the second ends of the wirings to the external electrodes.

The external electrodes may be provided on the surfaces of the protruding electrodes corresponding to the external electrodes.

The external electrodes each may be formed of a ball electrode.

A method for manufacturing a semiconductor device according to the present invention is a method for manufacturing a semiconductor device to be mounted on a packaging substrate. The method includes a semiconductor wafer preparation process for preparing a semiconductor wafer, the semiconductor wafer including a plurality of first semiconductor chips whose surfaces on a side of the packaging substrate are provided with a plurality of first electrode pads, for electrically connecting the semiconductor device to the packaging substrate, a protruding electrode forming process for forming protruding electrodes respectively so as to protrude from the first electrode pads, which are provided on the surfaces of the first semiconductor chips on the side of the packaging substrate, toward a direction perpendicular to the surfaces, a second semiconductor chip mounting process, after the protruding electrode forming process, for mounting second semiconductor chips on the first semiconductor chips respectively so as to be surrounded by the plurality of first electrode pads provided on the first semiconductor chips, and a grinding process for grinding surfaces of the protruding electrodes and surfaces of the second semiconductor chips on a side opposite to the first semiconductor chips so that the surfaces of the protruding electrodes and the surfaces of the second semiconductor chips on the side opposite to the first semiconductor chips are substantially flush with each other.

Accordingly, since the surfaces of the protruding electrodes and the surfaces of the second semiconductor chips on the side opposite to the first semiconductor chips are ground together, the surfaces of the protruding electrodes and the surfaces of the second semiconductor chips on the side opposite to the first semiconductor chips are made substantially flush with each other. This improves the reliability of the structure for electrically connecting the first semiconductor chip provided in the semiconductor device to the packaging substrate, compared with the conventional structure in which the wiring layers break easily at the slope-like step between the insulating layer and the principal surface of the first semiconductor chip, because no protruding electrode is provided.

A plurality of second electrode pads for electrically connecting the second semiconductor chips to the first semiconductor chips may be provided on the surfaces of the first semiconductor chips formed in the semiconductor wafer prepared in the semiconductor wafer preparation process. The method further may include a resin forming process, before the grinding process, for forming a resin on the surfaces of the first semiconductor chips for sealing at least a gap between the first semiconductor chips and the second semiconductor chips.

The resin forming process may form the resin so as to cover the protruding electrodes respectively formed on the first electrode pads of the first semiconductor chips.

The protruding electrode forming process may form the protruding electrodes into a cylindrical or prismatic shape.

The plurality of first electrode pads provided on each of the first semiconductor chips formed in the semiconductor wafer prepared in the semiconductor wafer preparation process may be arranged on a periphery of the surface of each of the first semiconductor chips.

The second semiconductor chip mounting process may flip-chip mount the second semiconductor chips on the first semiconductor chips.

The method further may include a wiring forming process, after the grinding process, for forming wirings connected to the protruding electrodes. The wiring forming process may form the wirings so that first ends of the wirings are connected to the surfaces of the protruding electrodes, and second ends of the wirings extend on the surfaces of the second semiconductor chips on the side opposite to the first semiconductor chips.

The method further may include an external electrode forming process, after the wiring forming process, for forming a plurality of external electrodes for connecting the wirings to the packaging substrate on which the semiconductor device is to be mounted. The external electrodes each may be formed of a ball electrode.

The method further may include a resist resin forming process, after the wiring forming process, for forming a resist resin having a plurality of openings reaching the second ends of the wirings.

The method further may include a process, after the resist resin forming process, for forming external electrodes respectively in the openings of the resist resin in order to connect the wirings to the packaging substrate on which the semiconductor device is to be mounted.

The method further may include a process, after the grinding process, for dividing the semiconductor wafer in each of the first semiconductor chips.

With respect to the first semiconductor chips, surfaces of the protruding electrodes formed in the protruding electrode forming process may be lower than surfaces of the second semiconductor chips on the side of the packaging substrate. The second semiconductor chips are mounted in the second semiconductor chip mounting process.

DESCRIPTION OF THE PREFERRED EMBODIMENTS

A semiconductor device according to the present embodiment improves the reliability of the structure for connecting electrode pads formed on a principal surface of a semiconductor chip provided in the semiconductor device and external electrodes for electrically connecting the electrode pads to a packaging substrate.

Figure 1A:
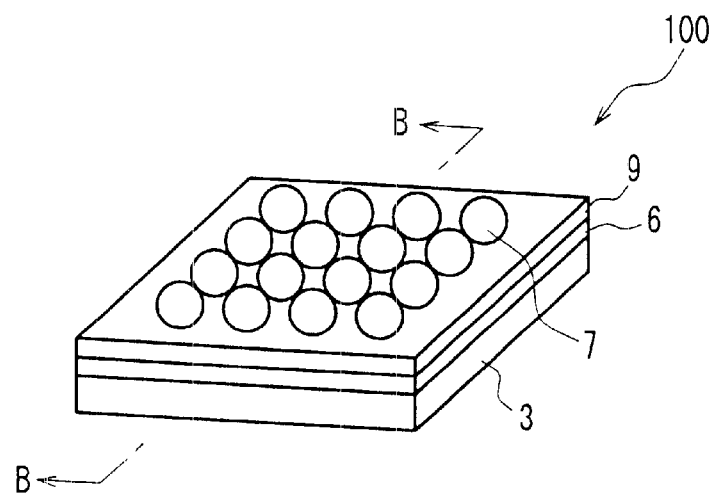
FIG. 1A is a perspective view showing a semiconductor device according to a present embodiment.
Figure 1B:
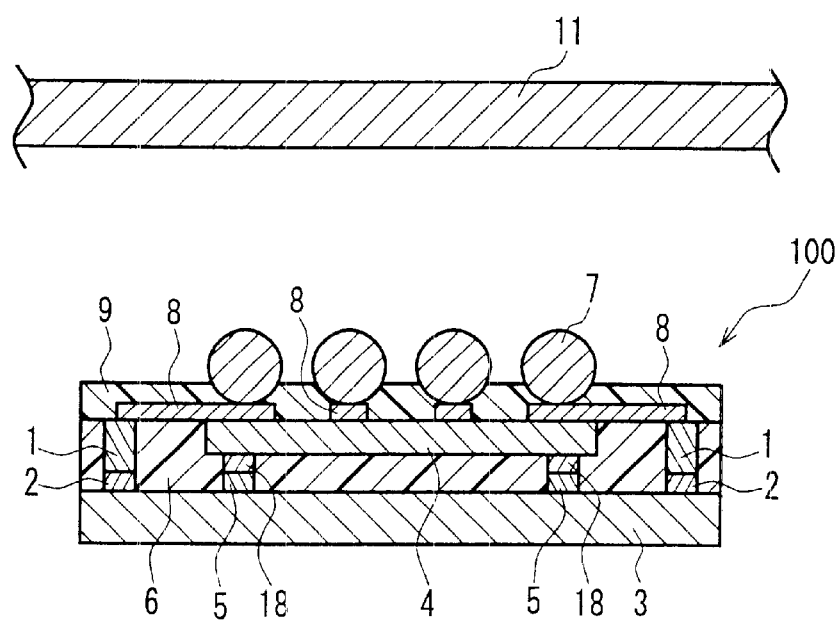
FIG. 1B is a sectional view showing the semiconductor device according to the present embodiment.

FIG. 1A is a perspective view showing a semiconductor device 100 according to the present embodiment, and FIG. 1B is a sectional view thereof taken along a plane that is perpendicular to a principal surface of the semiconductor device 100 and includes the line B—B shown in FIG. 1A, and also shows a cross-section of a packaging substrate 11 on which the semiconductor device 100 is to be mounted. The semiconductor device 100 includes a substantially rectangular parallelepiped first semiconductor chip 3. On the periphery of a surface of the first semiconductor chip 3 on the side of the packaging substrate 11 (a principal surface), a plurality of first electrode pads 2 are provided for electrically connecting the first semiconductor chip 3 to the packaging substrate 11. Each of the first electrode pads 2 is connected to a semiconductor integrated circuit element (not shown) formed inside the first semiconductor chip 3.

On the principal surface of the first semiconductor chip 3, a substantially rectangular parallelepiped second semiconductor chip 4, which is smaller than the first semiconductor chip 3, is flip-chip mounted at a position surrounded by the plurality of first electrode pads 2. Between the second semiconductor chip 4 and the first semiconductor chip 3, a plurality of second electrode pads 5 and electrode pads 18 are provided. The plurality of second electrode pads 5 are formed on the principal surface of the first semiconductor chip 3 for electrically connecting the second semiconductor chip 4 to the first semiconductor chip 3, and the electrode pads 18 are formed on the surface of the second semiconductor chip 4 on the side of the first semiconductor chip 3 and connected respectively to the second electrode pads 5. As described above, the semiconductor device 100 according to the present embodiment is a real chip size package (RCSP) type semiconductor device in which two semiconductor chips 3 and 4 are layered.

Each of the first electrode pads 2 is provided with a cylindrical or prismatic protruding electrode 1 that protrudes from the first electrode pad 2 toward the packaging substrate 11. Since the surfaces of the protruding electrodes 1 and the surface of the second semiconductor chip 4 on the side of the packaging substrate 11 are ground together, they are substantially flush with each other. Each of the protruding electrodes 1 is formed of a copper (Cu) material.

On the principal surface of the first semiconductor chip 3, a resin 6 is formed so as to seal at least the gap between the first semiconductor chip 3 and the second semiconductor chip 4. It is preferable that the resin 6 is formed so as to surround the second semiconductor chip 4, the first electrode pads 2 and the protruding electrodes 1. It is preferable that the surface of the resin 6 is substantially flush with the surface of the second semiconductor chip 4 on the side of the packaging substrate 11 and the surfaces of the protruding electrodes 1. It is preferable that the resin 6 is formed of a low-elasticity resin. The elastic modulus (Young's modulus) of the resin 6 preferably is equal to or more than 10 kg/mm$^2$ and equal to or less than 2000 kg/mm$^2$, and more preferably is equal to or more than 10 kg/mm$^2$ and equal to or less than 1000 kg/mm$^2$. The coefficient of linear expansion of the resin 6 preferably is equal to or more than 5 ppm/° C., and equal to or less than 200 ppm/° C., and more preferably is equal to or more than 10 ppm/° C. and equal to or less than 100 ppm/° C. The resin 6 appropriately is formed of, for example, a polymer such as an ester linkage type polyimide or an acrylate epoxy and appropriately has a low elasticity and an insulating property. The thickness of the resin 6 is equal to or more than 1 μm and equal to or less than 100 μm, and preferably is about 30 μm.

On the surface of the second semiconductor chip 4 on the side of the packaging substrate 11, an insulating thin film, which is not shown in the figure, is formed. The surfaces of the protruding electrodes 1 are connected with first ends of wiring layers 8. Each of the wiring layers 8 extends transversely on the surface of the resin 6 between the protruding electrode 1 and the second semiconductor chip 4 and over the insulating thin film (not shown) formed on the surface of the second semiconductor chip 4 on the side of the packaging substrate 11. Second ends of the wiring layers 8 are arranged in a matrix form on the insulating thin film formed on the surface of the second semiconductor chip 4 on the side of the packaging substrate 11.

A resist resin 9 is formed on the resin 6 so as to cover the wiring layers 8. The resist resin 9 is provided with a plurality of openings in a matrix form such that the openings respectively reach the second ends of the plurality of wiring layers 8 arranged in a matrix form. In the plurality of openings provided in the resist resin 9, a plurality of substantially spherical ball electrodes 7 as an external electrode respectively are placed in a matrix form for connecting the second ends of the plurality of wiring layers 8 to the packaging substrate 11.

As described above, the plurality of first electrode pads 2 provided on the periphery of the surface of the first semiconductor chip 3 on the side of the packaging substrate 11 are rewired via the protruding electrodes 1 and the wiring layers 8 to the ball electrodes 7, which are arranged two-dimensionally.

The wiring layers 8 are patterned so that the second ends of the wiring layers 8 in which the ball electrodes 7 serving as an external electrode are provided are arranged in a matrix form on the surface of the second semiconductor chip 4 on the side of the packaging substrate 11. This makes it possible to provide many external electrodes in a small area. Thus, a small and thin semiconductor device that is capable of adapting to the larger number of pins can be obtained.

The following is a description of a method for manufacturing the semiconductor device 100 with the above structure according to the present embodiment. FIGS. 2A to 2J are sectional views for describing the method for manufacturing the semiconductor device 100 according to the present embodiment. The method for manufacturing the semiconductor device according to the present embodiment is directed to a method for manufacturing a highly reliable real chip size package (RCSP) type semiconductor device at a semiconductor wafer level.

Figure 2A:
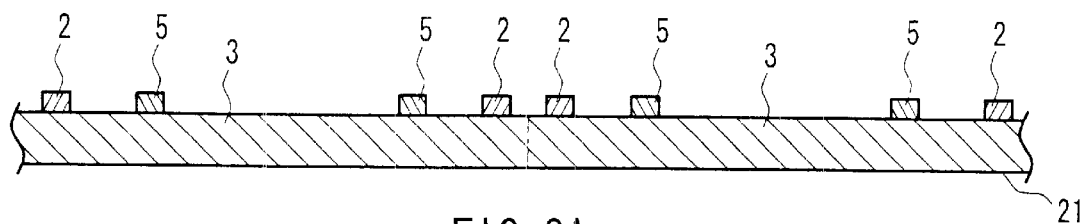
FIGS. 2A to 2J are sectional views for describing a method for manufacturing the semiconductor device according to the present embodiment.

First, as shown in FIG. 2A, a semiconductor wafer 21 in which a plurality of the substantially rectangular parallelepiped first semiconductor chips 3 are formed is prepared. A plurality of the first electrode pads 2 are arranged on the periphery of the principal surface of each of the first semiconductor chips 3 formed in the semiconductor wafer 21. A plurality of the second electrode pads 5 are provided on the principal surface of the first semiconductor chip 3 in such a manner as to be surrounded by the plurality of first electrode pads 2.

Figure 2B:
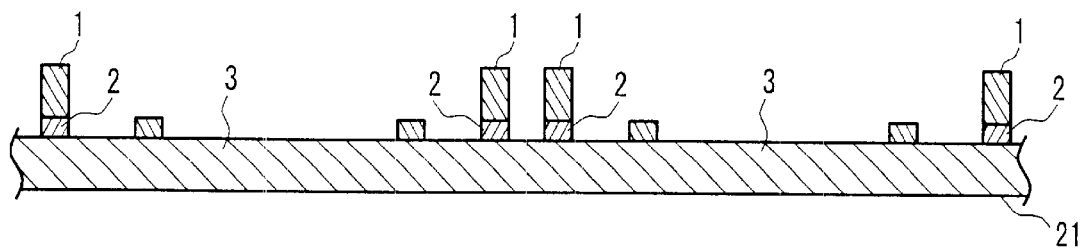

Next, as shown in FIG. 2B, the cylindrical or prismatic protruding electrodes 1 are formed so as to protrude from the first electrode pads 2 provided on the first semiconductor chip 3 formed in the semiconductor wafer 21 in the direction perpendicular to the principal surface of the first semiconductor chip 3. Each of the protruding electrodes 1 may be made of a copper (Cu) material, and formed to achieve a height of about 100 $\mu$m from the principal surface of the first semiconductor chip 3 by plating. Since the protruding electrodes 1 are grown by plating, it generally is difficult to form the protruding electrodes 1 to be higher than 100 $\mu$m.

Figure 2C:
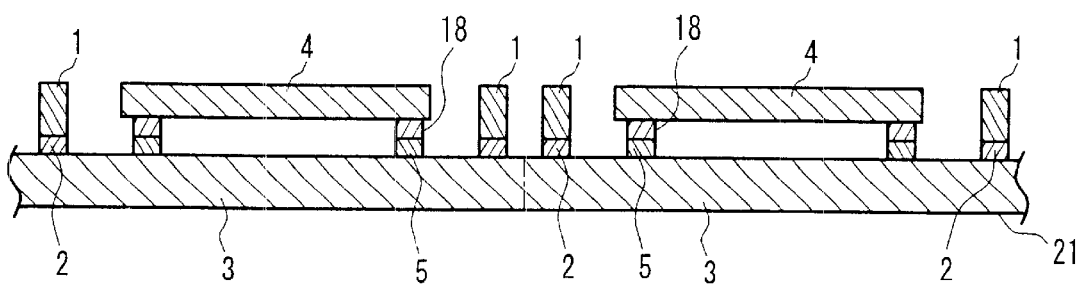

Then, as shown in FIG. 2C, the second semiconductor chip 4 is flip-chip mounted at a position surrounded by the plurality of first electrode pads 2 and protruding electrodes 1 provided on each of the first semiconductor chips 3. Thus, the surface area of the second semiconductor chip 4 is smaller than that of the first semiconductor chip 3. On the surface of the second semiconductor chip 4 on the side of the first semiconductor chip 3, electrode pads 18 are provided so as to correspond respectively to the second electrode pads 5 provided on the first semiconductor chip 3. The second semiconductor chip 4 is mounted on the first semiconductor chip 3 so that each of the electrode pads 18 is flip-chip connected to its corresponding second electrode pad 5. With respect to the first semiconductor chip 3, the surface of each protruding electrode 1 is slightly lower than the surface of the second semiconductor chip 4 on the side opposite to the first semiconductor chip 3.

Figure 2D:
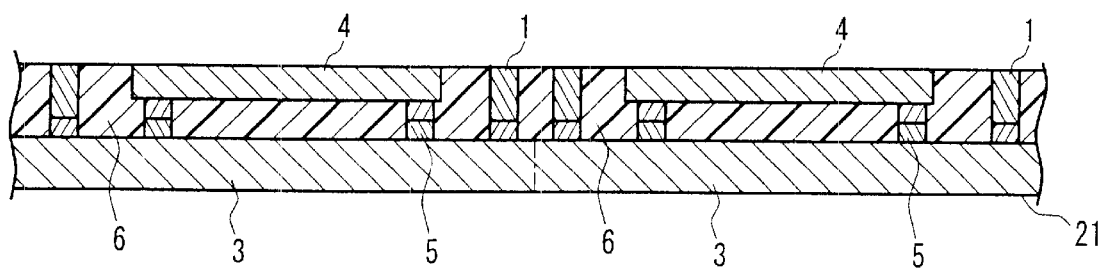

Thereafter, as shown in FIG. 2D, the resin 6 is formed so as to cover the entire surface of the semiconductor wafer 21. The resin 6 is formed so as to seal the gap between the first semiconductor chip 3 and the second semiconductor chip 4 mounted on the first semiconductor chip 3. The resin 6 also is formed so as to cover slightly the surfaces of the protruding electrodes 1, which are slightly lower than the surface of the second semiconductor chip 4 on the side opposite to the first semiconductor chip 3, and to expose the surface of the second semiconductor chip 4 on the side opposite to the first semiconductor chip 3, which is slightly higher than the surfaces of the protruding electrodes 1. Since the entire surface of the semiconductor wafer 21 is sealed at the same time by transfer molding, this resin forming process is suitable for mass-production of semiconductor devices.

Figure 2E:
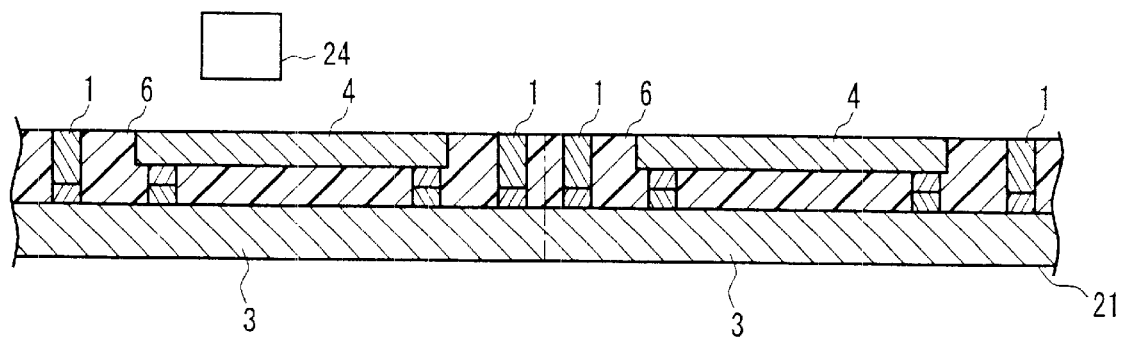

Subsequently, as shown in FIG. 2E, the surfaces of the protruding electrodes 1 formed on the first semiconductor chip 3 and the surface of the second semiconductor chip 4 on the side opposite to the first semiconductor chip 3 are ground together with the surface of the resin 6 so that they are substantially flush with each other. In this case, the surfaces of the protruding electrodes 1, the surface of the second semiconductor chip 4 on the side opposite to the first semiconductor chip 3 and the surface of the resin 6 are ground using a back grinder 24, which normally is used for grinding a back surface of the semiconductor wafer 21. When the surface of the second semiconductor chip 4 on the side opposite to the first semiconductor chip 3 is ground so as to achieve a height of the second semiconductor chip 4 from the principal surface of the first semiconductor chip 3 from about 50 $\mu$m to about 100 $\mu$m, the surfaces of the protruding electrodes 1 also are ground at the same time and, therefore, become substantially flush with the surface of the second semiconductor chip 4 on the side opposite to the first semiconductor chip 3. It is preferable that the surface of the second semiconductor chip 4 on the side opposite to the first semiconductor chip 3 is ground so as to achieve a height from the surface of the first semiconductor chip 3 of about 70 $\mu$m. Then, the insulating thin film, which is not shown in the figure, is formed on the surface of the second semiconductor chip 4 on the side of the packaging substrate 11.

The thickness of the first semiconductor chip 3 is about 200 $\mu$m. The thickness of the second semiconductor chip 4 is designed by considering the balance between a stress generated in the first semiconductor chip 3 in relation to the thickness thereof and that generated in the second semiconductor chip 4 in relation to the thickness thereof.

As described referring to FIG. 2B, since the protruding electrodes 1 are grown by plating, it is difficult to form the protruding electrodes 1 to be higher than 100 $\mu$m with respect to the principal surface of the first semiconductor chip 3. Accordingly, as described referring to FIG. 2C, with respect to the first semiconductor chip 3, the surface of each protruding electrode 1 is slightly lower than the surface of the second semiconductor chip 4 on the side opposite to the first semiconductor chip 3. However, in the present embodiment, since the surface of the second semiconductor chip 4 on the side opposite to the first semiconductor chip 3 and the surfaces of the protruding electrodes 1 are ground together, they can be made substantially flush with each other. This makes it possible to achieve a layered chip structure that conforms to the height of the protruding electrodes 1 from the first semiconductor chip 3.

Figure 2F:
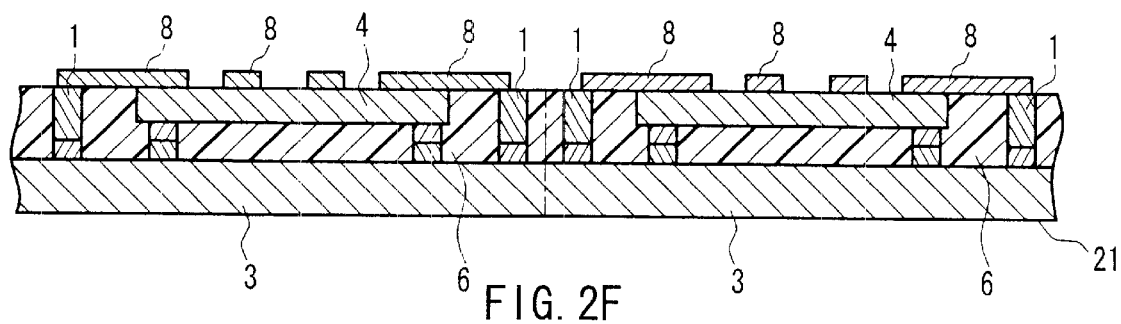

Then, as shown in FIG. 2F, the wiring layers 8 are formed so that their first ends are connected to the surfaces of the protruding electrodes 1 provided on the first semiconductor chip 3. Each of the wiring layers 8 extends transversely on the surface of the resin 6 between the protruding electrode 1 and the second semiconductor chip 4 and over the insulating thin film (not shown) formed on the surface of the second semiconductor chip 4 on the side opposite to the first semiconductor chip 3. Second ends of the wiring layers 8 are arranged in a matrix form on the insulating thin film formed on the surface of the second semiconductor chip 4 on the side opposite to the first semiconductor chip 3. More specifically, the wiring layers 8 are formed as follows. A thin film metal layer is formed on the surface of the second semiconductor chip 4 on the side opposite to the first semiconductor chip 3, the surfaces of the protruding electrodes 1 and the surface of the resin 6 by vacuum evaporation, sputtering, CVD or electroless plating. The thin film metal layer may be formed of, for example, a titanium (Ti) film having a thickness of about 0.2 $\mu$m and a copper (Cu) film having a thickness of about 0.5 $\mu$m formed on the titanium film. Then, a negative photoresist is applied onto the formed thin film metal layer. Subsequently, by curing a region in the applied negative photoresist other than a predetermined patterned region where the wiring layers 8 are to be formed and removing a reacted portion in the predetermined patterned region where the wiring layers 8 are to be formed, a plated resist film is formed in the region other than the predetermined patterned region where the wiring layers 8 are to be formed. On the thin film metal layer in the predetermined patterned region where the wiring layers 8 are to be formed other than the region where the plated resist film is formed, a thick film metal layer is formed selectively by electroplating. The thick film metal layer is formed of, for example, a copper (Cu) film and has a thickness of about 20 $\mu$m. Next, the plated resist film formed in the region other than the predetermined patterned region where the wiring layers 8 are to be formed is melted and removed. Thereafter, the entire surface is etched by an etchant capable of melting both the thin film metal layer and the thick film metal layer, for example, a cupric chloride solution for the copper (Cu) film and an EDTA solution for the titanium (Ti) film, thereby removing the thin film metal layer, which is thinner than the thick film metal layer, prior to the thick film metal layer formed in the predetermined patterned region where the wiring layers 8 are to be formed. As a result, the thin film metal layer remaining on the predetermined patterned region and the thick film metal layer on the thin film metal layer form the wiring layers 8.

Figure 2G:
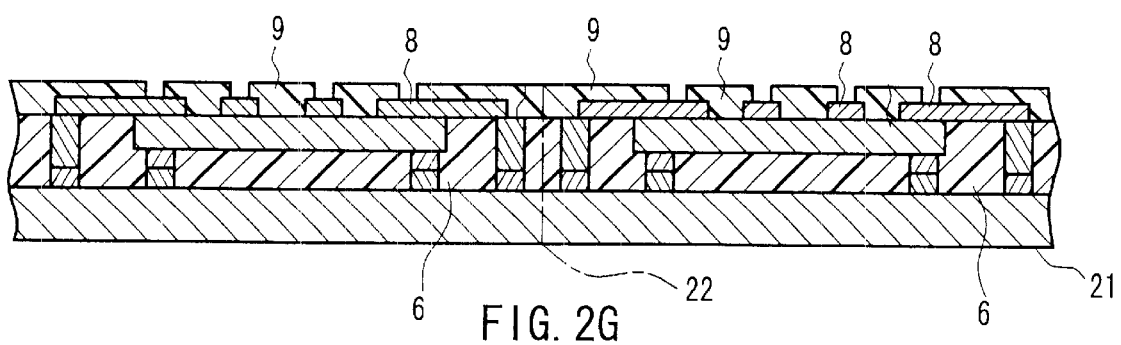

Subsequently, as shown in FIG. 2G, the resist resin 9 provided with a plurality of openings reaching the second ends of the wiring layers 8 is formed on the resin 6. The resist resin 9 is formed of, for example, a solder resist (an insulating resin). The resist resin 9 also protects the wiring layers 8 against a molten solder for mounting the semiconductor device 100 on the packaging substrate 11. More specifically, the resist resin 9 is formed as follows. First, a solder resist having a photosensitivity is applied onto the resin 6 so as to cover the wiring layers 8. Subsequently, the plurality of openings respectively reaching the second ends of the wiring layers 8 are formed on the solder resist applied onto the resin 6 by using a photolithography technique.

Figure 2H:
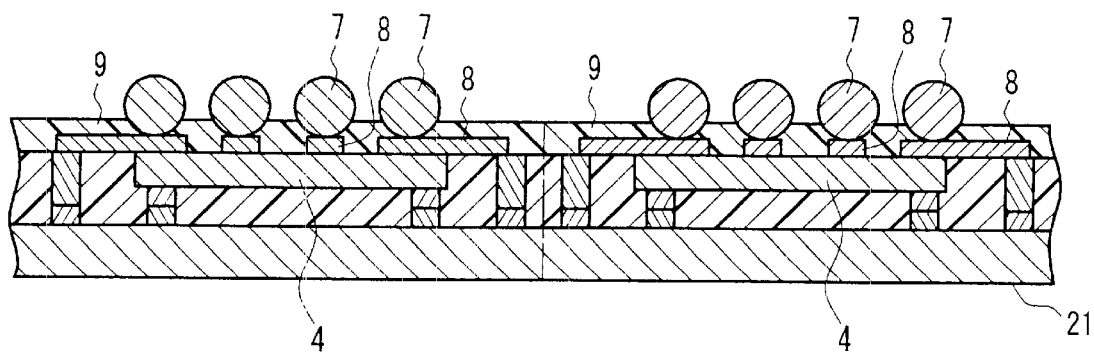

Thereafter, as shown in FIG. 2H, in the openings formed in the resist resin 9, the ball electrodes 7 are formed in such a manner as to be connected to the second ends of the wiring layers 8. Each of the ball electrodes 7 is formed of a solder ball. More specifically, the metal ball electrodes 7 formed of solder, copper plated with solder or nickel plated with solder are placed on the exposed second ends of the wiring layers 8 in the opening formed in the resist resin 9, so that the ball electrodes 7 and the second ends of the wiring layers 8 are melted and joined.

Figure 2I:
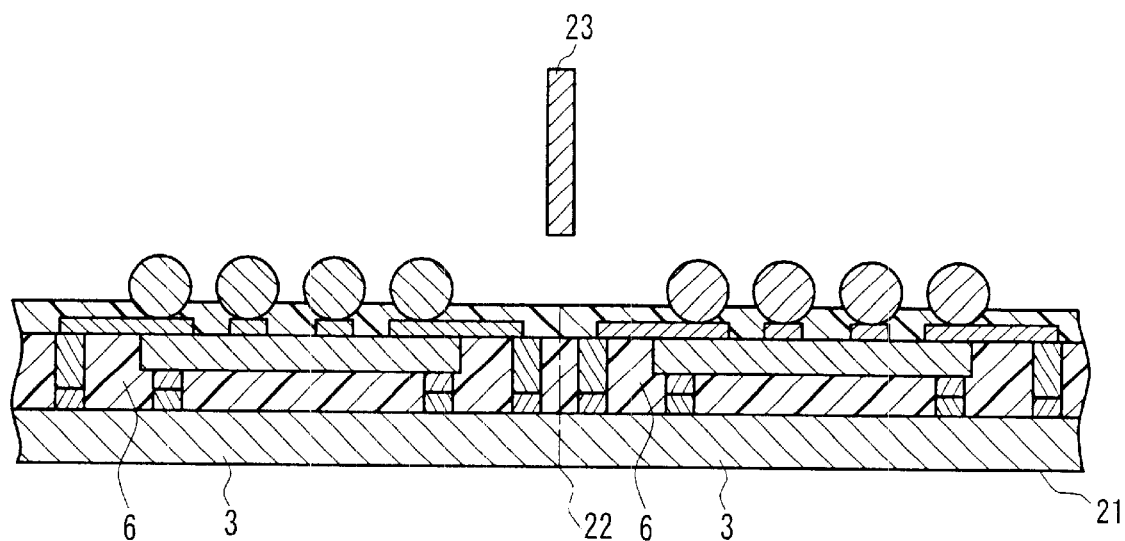
Figure 2J:
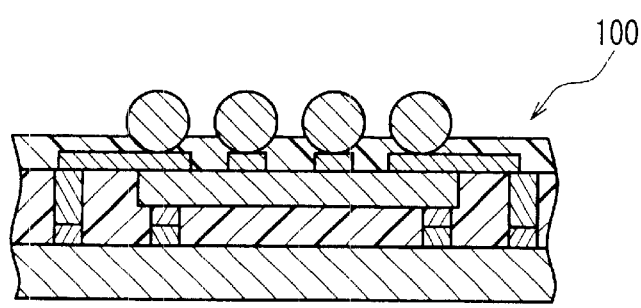

Then, as shown in FIG. 2I, the semiconductor wafer 21 is divided into each of the first semiconductor chips 3 with the rotating blade 23 that rotates around an axis of rotation in parallel with the principal surface of the first semiconductor chip 3 along a dicing scribe line 22 set between the plurality of first semiconductor chips 3 formed in the semiconductor wafer 21. Each semiconductor wafer obtained by a division in each of the first semiconductor chips 3 forms the semiconductor device 100 according to the present embodiment, which is shown in FIG. 2J.

As described above, in accordance with the present embodiment, since the surfaces of the protruding electrodes 1 formed so as to protrude from the first electrode pads 2 provided on the first semiconductor chip 3 toward the packaging substrate 11 and the surface of the second semiconductor chip 4 on the side of the packaging substrate 11 are ground together, they are substantially flush with each other. Thus, compared with the conventional structure in which the wiring layer may break at a slope-like step between the principal surface of the first semiconductor chip and the insulating layer, it is possible to improve reliability of the structure for electrically connecting the first semiconductor chip 3 provided in the semiconductor device to the packaging substrate 11.

Also, in accordance with the present embodiment, first ends of the wiring layers 8 for connecting the protruding electrodes 1 and the ball electrodes 7 are connected to the surfaces of the protruding electrodes 1, while the second ends of the wiring layers 8 extend on the surface of the second semiconductor chip 4 on the side of the packaging substrate 11, which is substantially flush with the surfaces of the protruding electrodes 1, and are connected to the ball electrodes 7. This makes it possible to improve reliability of the structure of the wiring layers 8 for connecting the protruding electrodes 1 provided on the first electrode pads 2 formed on the first semiconductor chip 3 to the ball electrodes 7.

The present embodiment is directed to an example in which the plurality of protruding electrodes 1 are connected respectively via the wiring layers 8 to the plurality of ball electrodes 7 provided on the surface of the second semiconductor chip 4 on the side opposite to the first semiconductor chip 3 in a matrix form as external electrodes, so that the external electrodes constitute an area array type semiconductor device. However, the present invention is not limited to this. It may be possible to provide, after the grinding process described above referring to FIG. 2E, the ball electrodes 7 as the external electrodes directly on the surface of the protruding electrodes 1 and constitute a peripheral type semiconductor device with a plurality of the external electrodes provided on the periphery of the principal surface of the first semiconductor chip 3.

Furthermore, the resin 6 and the resist resin 9 are formed so as to cover the dicing scribe line 22 set between the first semiconductor chips 3 in the above example. However, they may be formed so as to expose the dicing scribe line 22. For instance, a resin layer is formed by applying a low-elasticity resin material having a photosensitivity and an insulating property with a desired thickness, followed by drying. Then, the dried resin layer is subjected to exposure and development alternately, thereby exposing the dicing scribe line 22. The resin material having a photosensitivity can be a low-elasticity polymer having an insulating property such as an ester linkage type polyimide or an acrylate epoxy. The photosensitive resin material need not be formed by drying a liquid material but may be a resin material formed into a film form in advance. When using such a film-like resin material, it is possible to attach this film-like resin material to the semiconductor wafer 21 and subject it to exposure and development, thereby forming an opening for exposing the dicing scribe line 22 set on the semiconductor wafer 21 on the film-like resin material. Also, a resin material having no photosensitivity is subjected to a mechanical processing by a laser or plasma or a chemical processing such as etching, thereby exposing the dicing scribe line 22 set on the semiconductor wafer 21.

When the resin 6 and the resist resin 9 are formed so as to expose the dicing scribe line 22 as described above, the rotating blade 23 cut only the first semiconductor chip 3 and does not cut the resin 6 or the resist resin 9 at the time of dividing the semiconductor wafer 21 in each of the first semiconductor chips 3. Therefore, since no shock or external pressure generated when the rotating blade 23 cuts the first semiconductor chip 3 is applied to the resin 6, it is possible to prevent the resin 6 from peeling off from the first semiconductor chip 3 at the time of dividing the semiconductor wafer 21 in each of the first semiconductor chips 3 with the rotating blade 23.

Furthermore, although the ball electrodes 7 are formed of solder balls in the above example, they may be bump-like protruding electrodes formed of a metal material.

A bump may be formed in advance on either the surface of the second electrode pad 5 provided on the first semiconductor chip 3 or that of the electrode pad 18 provided on the second semiconductor chip 4, thereby flip-chip mounting the second semiconductor chip 4 on the first semiconductor chip 3.

Although copper (Cu) is used as the material for the thin film metal layer and the thick film metal layer for forming the wiring layers 8 in the above example, Cr, W, Ti/Cu or Ni may be used instead of copper (Cu). Also, it may be possible to form the thin film metal layer and the thick film metal layer with different metal materials for forming the wiring layers 8 and, in the final etching process, to use an etchant that etches selectively only the thin film metal layer formed in the region other than the predetermined patterned region where the wiring layers 8 are to be formed.

Although the negative photoresist is used when providing the plated resist film for forming the wiring layers 8 in the above example, a positive photoresist also may be used.

Figure 2K:
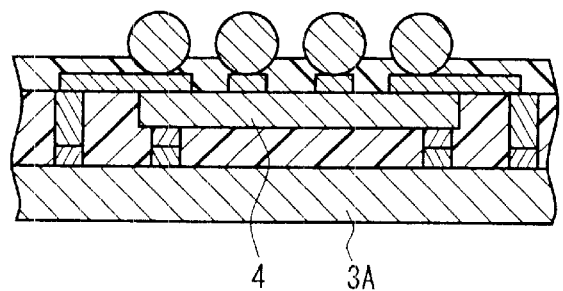
FIG. 2K is a sectional view for describing another method for manufacturing the semiconductor device according to the present embodiment.
Figure 3A:
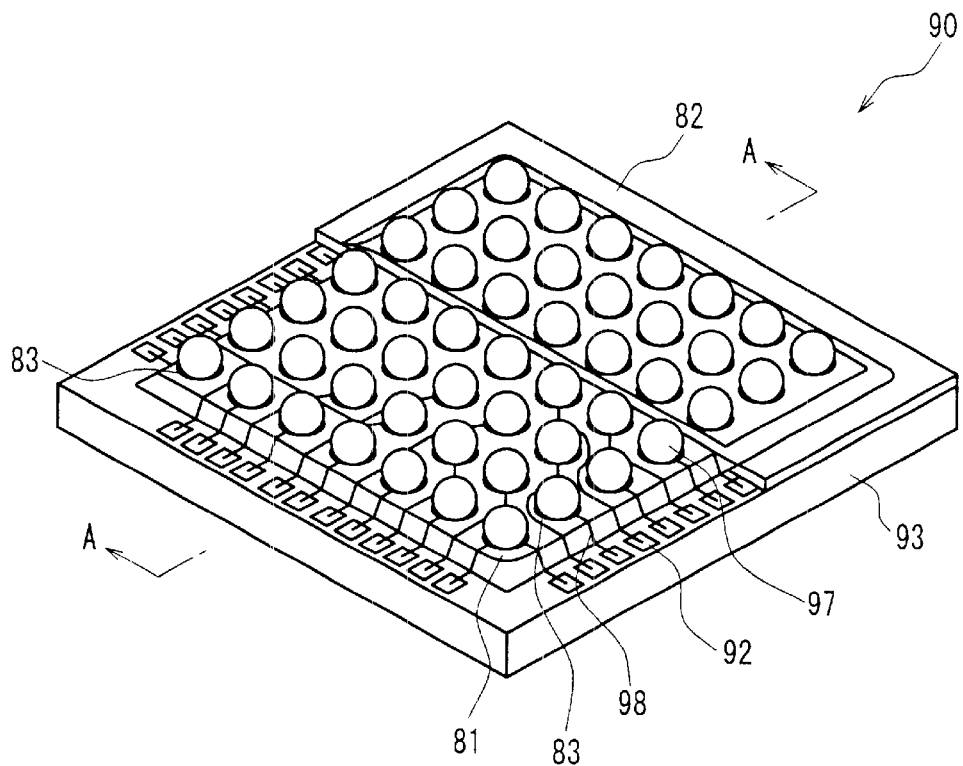
FIG. 3A is a perspective view showing a conventional semiconductor device.
Figure 3B:
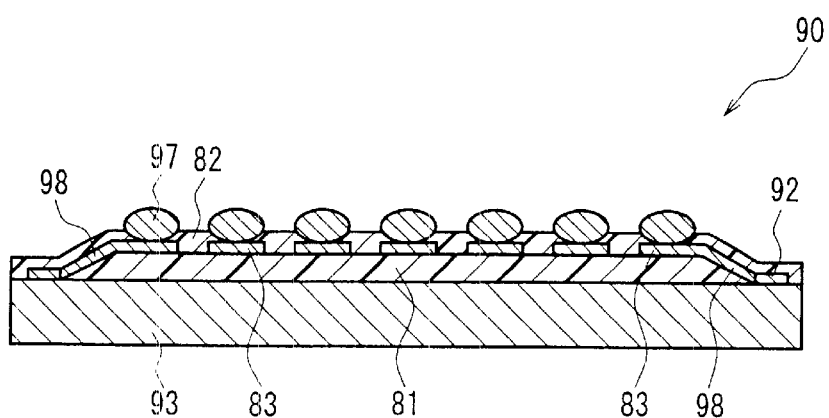
FIG. 3B is a sectional view showing the conventional semiconductor device.
Figure 4A:
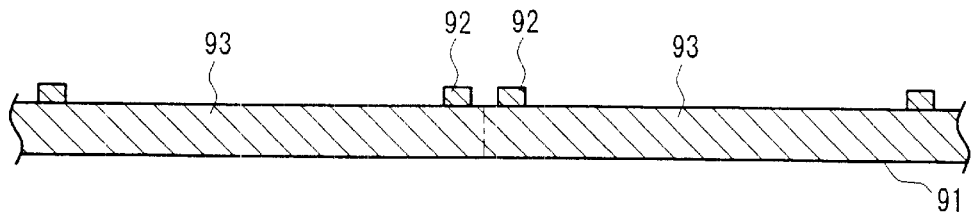
FIGS. 4A to 4G are sectional views for describing a method for manufacturing the conventional semiconductor device.
Figure 4B:
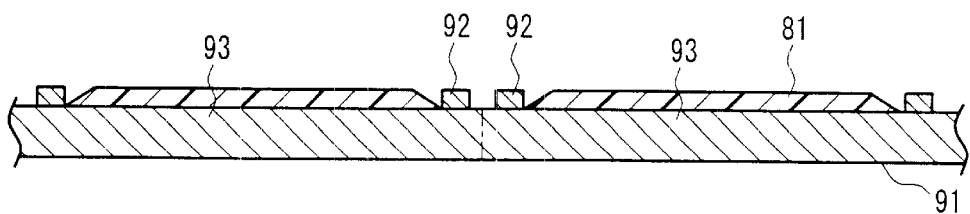
Figure 4C:
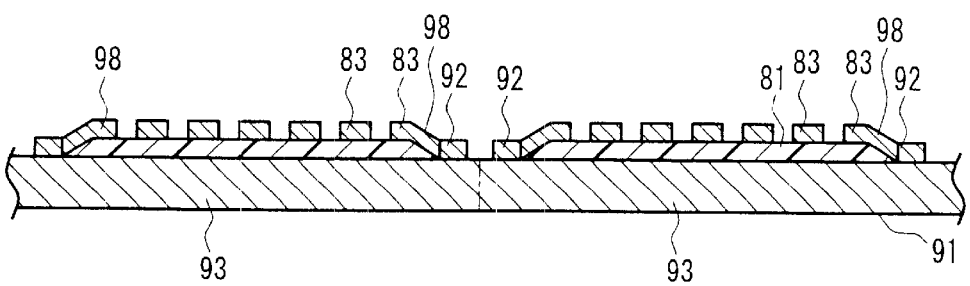
Figure 4D:
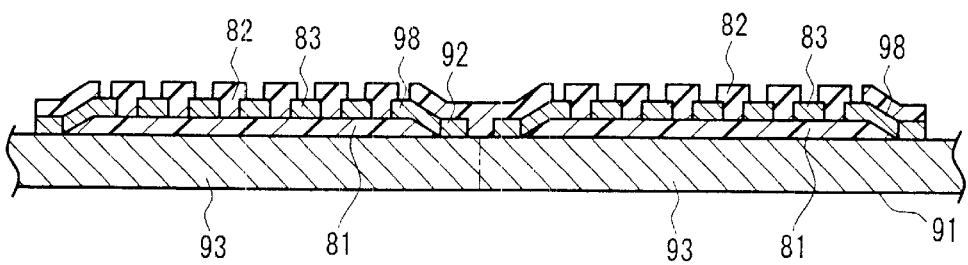
Figure 4E:
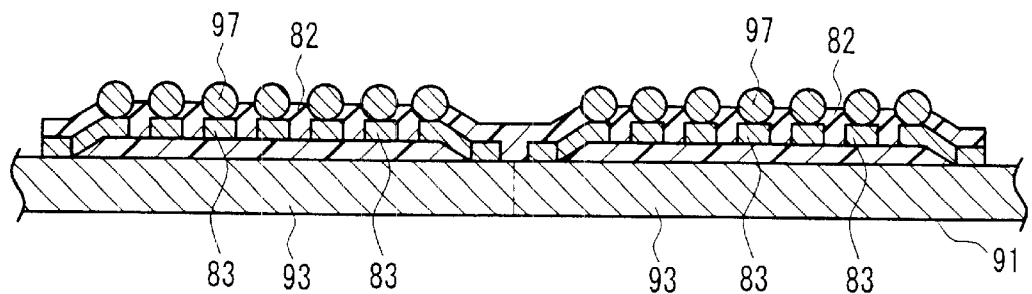
Figure 4F:
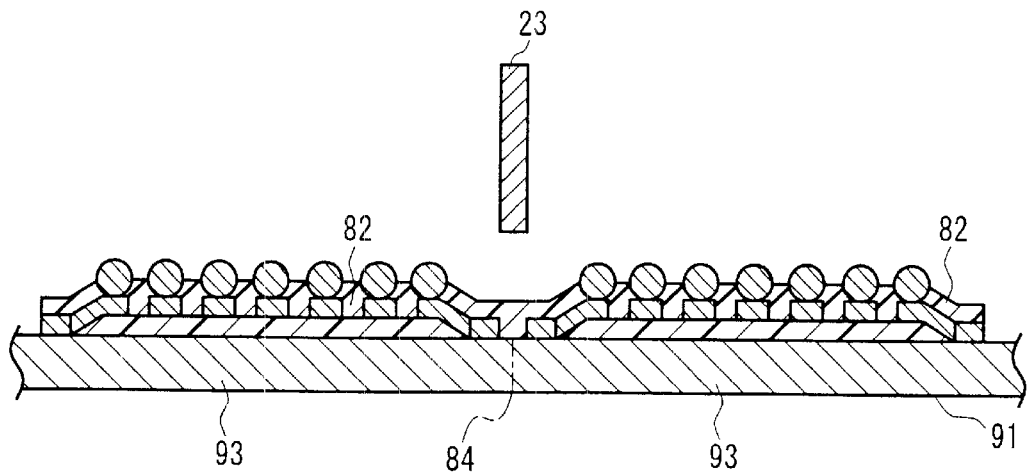
Figure 4G:
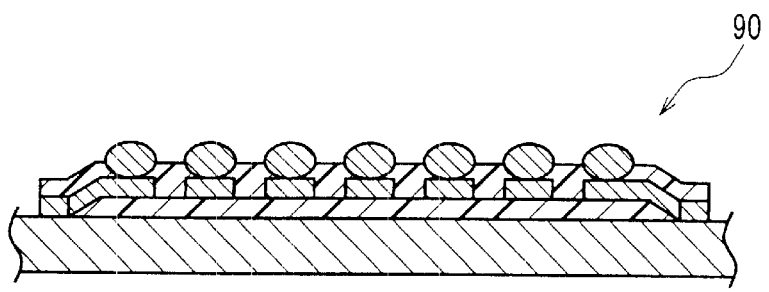

FIG. 2K is a sectional view for describing another method for manufacturing the semiconductor device according to the present embodiment. It may be possible to grind the surface of the first semiconductor chip 3 on the side opposite to the second semiconductor chip 4, thereby forming a thin first semiconductor chip 3A. When the thickness of the first semiconductor chip 3A and that of the second semiconductor chip 4 are designed by considering the areas of the first semiconductor chip 3A and the second semiconductor chip 4, the shapes thereof, the warps thereof in relation to the thickness of the resin 6 and the influence of a stress applied to a flip-chip connection part between the first semiconductor chip 3A and the second semiconductor chip 4, it is possible to obtain a semiconductor device that has a higher structural reliability and a higher reliability when being mounted on a packaging substrate.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor device to be mounted on a packaging substrate, comprising:
   a first semiconductor chip;
   a plurality of first electrode pads, provided on a surface of the first semiconductor chip on a side of the packaging substrate, for electrically connecting the first semiconductor chip to a packaging substrate;
   a second semiconductor chip mounted on the first semiconductor chip so as to be surrounded by the plurality of first electrode pads;
   protruding electrodes respectively provided so as to protrude from the first electrode pads toward a packaging substrate so that their surfaces are substantially flush with a surface of the second semiconductor chip on a side of a packaging substrate; and
   external electrodes respectively provided so as to correspond to the protruding electrodes, for connecting the protruding electrodes to a packaging substrate on which the semiconductor device is to be mounted;
   wherein the external electrodes are arranged on the surface of the second semiconductor chip on the side of a packaging substrate, and
   the semiconductor device further comprises wirings for connecting the protruding electrodes to the external electrodes corresponding to the protruding electrodes.

2. The semiconductor device according to claim 1, wherein the plurality of first electrode pads are provided on a periphery of the surface of the first semiconductor chip.

3. The semiconductor device according to claim 1, wherein each of the external electrodes is formed of a ball electrode.

4. The semiconductor device according to claim 1, further comprising a plurality of second electrode pads, provided on the surface of the first semiconductor chip, for electrically connecting the second semiconductor chip to the first semiconductor chip;
   wherein the surface of the first semiconductor chip is provided with a resin formed so as to seal at least a gap between the first semiconductor chip and the second semiconductor chip.

5. The semiconductor device according to claim 4, wherein a surface of the resin is formed to be substantially flush with the surface of the second semiconductor chip on the side of a packaging substrate.

6. The semiconductor device according to claim 1, wherein first ends of the wirings are connected to the surfaces of the protruding electrodes, and
   second ends of the wirings extend on the surface of the second semiconductor chip on the side of a packaging substrate and are connected to the external electrodes.

7. The semiconductor device according to claim 6, further comprising a resist resin that is provided so as to cover the second semiconductor chip and the wirings and has a plurality of openings formed for connecting the second ends of the wirings to the external electrodes.

* * * * *